(12) United States Patent
Hotta

(10) Patent No.: US 6,709,803 B2
(45) Date of Patent: Mar. 23, 2004

(54) PROCESS FOR PRODUCING PRINTED WIRING BOARD

(75) Inventor: Sinichi Hotta, Toyama (JP)

(73) Assignee: NEC Toppan Circuit Solutions, Inc., Tokyo (JP)

( * ) Notice: Subject to any disclaimer, the term of this patent is extended or adjusted under 35 U.S.C. 154(b) by 207 days.

(21) Appl. No.: 10/077,946

(22) Filed: Feb. 20, 2002

(65) Prior Publication Data

US 2002/0117400 A1 Aug. 29, 2002

(30) Foreign Application Priority Data

Feb. 26, 2001 (JP) ........................... 2001-050812

(51) Int. Cl.$^7$ .................... G03F 7/00; C23C 28/02; H05K 3/10
(52) U.S. Cl. ................. 430/311; 430/313; 430/315; 430/322; 430/324; 29/846; 29/852; 205/187; 427/301; 427/304
(58) Field of Search ............... 430/311, 313, 430/315, 322, 324; 29/846, 852; 205/187; 427/301, 304

(56) References Cited

U.S. PATENT DOCUMENTS

| | | | |
|---|---|---|---|
| 5,096,522 A | * | 3/1992 | Kawachi et al. ............ 156/151 |
| 5,158,860 A | * | 10/1992 | Gulla et al. ................ 430/315 |
| 6,344,413 B1 | * | 2/2002 | Zurcher et al. ............. 438/678 |
| 6,406,750 B1 | * | 6/2002 | Izaki et al. ................. 427/304 |
| 6,512,186 B1 | * | 1/2003 | Nishiwaki et al. .......... 174/261 |

FOREIGN PATENT DOCUMENTS

| | | | |
|---|---|---|---|
| EP | 460548 | * 12/1991 | ............ C23C/18/20 |
| JP | 62-69696 | 3/1987 | |
| JP | 6-69632 | 3/1994 | |
| JP | 7-297520 | 11/1995 | |

\* cited by examiner

*Primary Examiner*—Mark F. Huff
*Assistant Examiner*—Nicole Barreca
(74) *Attorney, Agent, or Firm*—Young & Thompson

(57) ABSTRACT

After forming first catalyst cores on the surfaces of adhesive layers of an insulating substrate, a plating resist is patterned. The insulating substrate is treated with an aqueous solution containing an anionic surfactant. Then, the insulating substrate is soaked successively in a palladium—tin mixed colloid catalyst solution and an accelerator solution, whereby second catalyst cores are formed on the surface of the adhesive layer not covered with the plating resist. Thereafter, conductive circuits are formed by electroless copper plating. Due to the anionic surfactant, adsorption of the palladium—tin mixed colloid catalyst to the plating resist is suppressed, and the first catalyst cores promote the formation of second catalyst cores. By setting the concentration of the first catalyst cores to $4\times10^{-8}$ atomic mol/cm$^2$ or less, a fine conductive circuit with a line width/line space of 50 μm or less having a high electrical insulating property between circuit lines can be formed.

12 Claims, 5 Drawing Sheets

PROCESS FOR PRODUCING PRINTED WIRING BOARD

BACKGROUND OF THE INVENTION

1. Field of the Invention

The present invention relates to a process for producing a printed wiring board, and particularly to a process for producing a printed wiring board by a so-called full-additive process in which a conductor pattern is additively formed on the surface of an insulating substrate by electroless copper plating.

2. Description of the Prior Art

With the recent development of electronic equipment, electronic components have undergone a significant shift to high density and multifunction, and there is a demand for high-density wiring in printed wiring boards. As a result, a further reduction in line width and line space is required in the printed wiring boards. Under these circumstances, attention is being paid to a process for producing a printed wiring board by additively forming a conductor pattern on the surface of an insulating substrate by electroless copper plating (so-called full-additive process).

A printed wiring board obtained by the full-additive process has a satisfactory dimensional accuracy, as compared with a printed wiring board produced by a conventional process for forming a circuit by plating and etching (subtractive process). Furthermore, the printed wiring board of the circuit of the rectangular section shape obtained by the full-additive process, so that such aboard is suitable for high-density wiring with a narrow line width and space. The dimensional accuracy of a circuit produced by the full-additive process is determined by the dimensional accuracy of a plating resist layer. Therefore, by controlling the dimensional accuracy of the resist layer, a conductive circuit with a high dimensional accuracy can be obtained more easily.

General production steps for a printed wiring board by the full-additive process will be described with reference to FIGS. 1A to 1D. An insulating substrate 102 with an adhesive layer 101 for enhancing plating adhesion formed on the surface of a base substrate 100 such as an epoxy glass substrate or the like is subjected to roughening treatment (FIG. 1A) with a roughening solution such as an alkaline permanganate solution. Then, catalyst cores 103 for electroless copper plating are allowed to adhere to the surface of the roughened adhesive layer 101 (FIG. 1B). Then, regions excluding circuit forming regions are covered with a plating resist 105 having resistance to a plating solution (FIG. 1C). Thereafter, the entire substrate is soaked in an electroless copper plating solution, whereby a copper plating film is deposited on the regions not covered with the plating resist 105 (i.e., circuit forming regions) by electroless copper plating to form conductive circuits 106. Thus, a printed wiring board 200 is produced.

In the case where through-holes are required for allowing both sides of the printed wiring board 200 to have electric conductivity, through-holes 104 are formed before roughening the adhesive layer 101 (FIG. 1B), and the walls of the through-holes 104 are covered with a copper plating film by electroless copper plating simultaneously with the formation of the conductive circuits on the surface of the printed wiring board, whereby copper plated through-holes 107 are formed (FIG. 1D).

However, in the above-mentioned printed wiring board produced by the conventional full-additive process, the plating catalyst cores 103 are present under the plating resist 105. Therefore, when the line space becomes smaller than 100 μm, reliability in electrical insulation between adjacent circuit lines may degrade due to moisture absorption or the like. This is because the catalyst cores present between the lines are ionized with an applied voltage due to moisture absorption and migrate therebetween.

Japanese Patent Application Laid-open No. Sho 62-69696 (hereinafter, referred to as "first prior art technique") discloses a technique of adding silicone oil or fluorine oil to a plating resist so as to improve water repellent of the resist and suppress adsorption of a catalyst solution (palladium—tin colloid solution) to the resist surface, and selectively forming catalyst cores on the surfaces not covered with the resist (i.e., circuit forming regions). According to this technique, due to water repellent of the plating resist, a catalyst is unlikely to adsorb to the surface of the plating resist. Furthermore, even if a catalyst adsorbs to the surface of the plating resist, the adhesion between the catalyst cores and the plating resist is small, so that the catalyst cores on the plating resist can be easily removed by high-pressure water washing or the like, whereby the insulating property between circuits is enhanced.

Furthermore, Japanese Patent Application Laid-open No. Hei 7-297520 (hereinafter, referred to as "second prior art technique") discloses a technique of selectively forming catalyst cores on the surfaces not covered with a plating resist, using a copper metal colloid solution. According to this technique, a plating resist is formed on an insulating substrate, and the resultant insulating substrate is treated with a catalyst solution of a copper metal colloid to allow a copper catalyst to adsorb to the surface of the insulating substrate and the surface of the plating resist. Then, the insulating substrate is treated with an alkaline permanganate solution, whereby the copper catalyst adsorbing to the plating resist is removed. A larger amount of copper catalyst adsorbs to the regions not covered with the resist (conductive circuit forming regions), as compared with the regions covered with the resist. Therefore, a portion of copper catalyst remains on the conductive circuit forming regions, without being completely removed with an alkaline permanganate solution. The copper catalyst is likely to be oxidized, so that a Pd catalyst is substituted for the copper catalyst by a substitution reaction with Pd ions. According to this technique, a copper catalyst is not present under the resist, so that the insulating property between circuits is enhanced.

Japanese Patent Application Laid-open No. Hei 6-69632 (hereinafter, referred to as "third prior art technique") discloses a technique of partially removing Sn of catalyst cores (Pd—Sn) adsorbing to an insulating substrate, forming a plating resist, and forming conductive circuits by electroless copper plating. According to this technique, the insulating substrate is treated with a hydrochloric acid solution or the like so that the Pd concentration of the catalyst cores adsorbing to the insulating substrate becomes 1 to 10 $\mu g/cm^2$ and the Sn concentration thereof becomes 0.1 to 2 $\mu g/cm^2$, and the concentration of the catalyst cores under the plating resist is controlled, thereby preventing the insulation resistance between circuit lines from being degraded.

However, the above-mentioned first to third prior art techniques have the following problems.

(1) According to the first prior art technique, it is difficult to completely remove catalyst cores from the surface of the plating resist, which makes it difficult to avoid electroless copper deposition onto the surface of the plating resist.

(2) According to the second prior art technique, a copper catalyst in the circuit forming regions is also etched with an alkaline permanganate solution. Therefore, it is required to strictly control the treatment conditions of the alkaline permanganate solution, resulting in poor operability.

(3) According to the third prior art technique, Pd and Sn are present under the plating resist. Therefore, in the case where the line space is 100 µm or less, the insulating property between circuits is degraded due to moisture absorption.

SUMMARY OF THE INVENTION

Thus, it is an object of the present invention to provide a process for producing a printed wiring board which overcomes the problem regarding the insulating property between circuits of a printed circuit board produced by the above-mentioned conventional full-additive processes.

A process for producing a printed wiring board of the present invention includes: a first step of forming first catalyst cores for electroless plating made of single metal particles on an insulating surface of a substrate; a second step of patterning a plating resist on the substrate; a third step of forming second catalyst cores for electroless plating made of alloy particles on the surface of the substrate where the plating resist is not formed; and a fourth step of forming conductive circuits made of an electroless plating film on the surfaces of the substrate where the first catalyst cores and the second catalyst cores are formed.

An electrical insulating property between conductive circuits formed in the fourth step is largely influenced by the concentration of the first catalyst cores on the surface of the substrate. In order to ensure reliability of the electrical insulating property between conductive circuits, the electrical insulation resistance between conductive circuits is required to be $10^9 \Omega$ or more. The preferable concentration of the first catalyst cores on the surface of the insulating substrate is $4 \times 10^{-8}$ atomic mol/cm$^2$ or less.

The lower the concentration of the first catalyst cores, the better the insulating property between conductive circuits. According to the present invention, the lower limit of the concentration of the first catalyst cores is set to $4.7 \times 10^{-9}$ atomic mol/cm$^2$. The purpose of this is to provide the first catalyst cores between the plating resists, and to allow the first catalyst cores to promote the formation of the second catalyst cores between the plating resists in the third step. As the first catalyst cores, metal particles of palladium (Pd) or copper (cu) can be used.

In the case where the first catalyst cores are made of Pd particles, the Pd particles are formed by allowing palladium complex ions, in which palladium ions are bound by ligands such as ammonia, pyridine, pyridine-3-sulfonic acid, and 2-aminopyridine, to adsorb to a substrate, followed by reducing with a reducing agent such as dimethylamine borane, sodium borohydride, or the like. The number of ligands binding to one Pd ion is 2 to 4.

In the case where the first catalyst cores are made of Cu metal particles, the Cu metal particles are formed by allowing a copper metal colloid to adsorb to a substrate.

According to the present invention, as the second catalyst cores, palladium—tin alloy particles are used. The palladium—tin alloy particles are formed by bringing a substrate into contact with a catalyst solution containing a palladium—tin mixed colloid. In order to suppress adsorption of the palladium—tin alloy particles to a plating resist, the plating resist is treated with an aqueous solution containing an anionic surfactant before bringing the substrate into contact with the catalyst solution containing a palladium—tin mixed colloid.

According to the process for producing a printed wiring board of the present invention, a fifth step may be included between the second and third steps, in which the first catalyst cores on the surface of the substrate where a plating resist is not formed are replaced by third catalyst cores having electroless plating catalyst performance by an ion substitution reaction. In this case, as the first catalyst cores, copper metal particles are used, and the copper metal particles can be replaced by the third catalyst cores made of more stable palladium, silver, and nickel metal particles by an ion substitution reaction.

According to the present invention, there is provided a process for producing a printed wiring board characterized in that catalyst cores are formed on the surface of an insulating substrate in a concentration of $4 \times 10^{-8}$ atomic mol/cm$^2$ or less, a plating resist is patterned and treated with an anionic surfactant solution, and the insulating substrate is treated with a catalyst solution containing a palladium—tin mixed colloid. By treating the plating resist with an anionic surfactant solution, adsorption of the palladium—tin mixed colloid to the surface of the plating resist can be suppressed. Catalyst cores previously formed on the surface of the substrate that is exposed between the plating resists have a function of promoting adsorption of a palladium—tin mixed colloid, and enhance the formation of an electroless plating film (electroless copper plating film) between the plating resists. By setting the concentration of the catalyst cores under the plating resist to $4 \times 10^{-8}$ atomic mol/cm$^2$ or less, a high insulating property can also be held between conductive circuits.

These and other advantages of the present invention will become apparent to those skilled in the art upon reading and understanding the following detailed description with reference to the accompanying figures.

DETAILED DESCRIPTION OF THE PREFERRED EMBODIMENTS

Hereinafter, the process for producing a printed wiring board of present invention will be described in detail by way of illustrative embodiments with reference to the drawings.

Figure 1A:
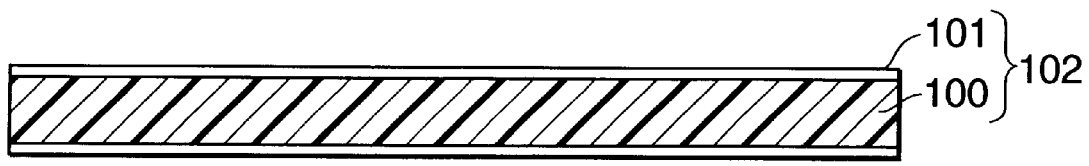
FIGS. 1A to 1D show production steps illustrating a process for producing a printed wiring board by a conventional full-additive process.
Figure 1B:
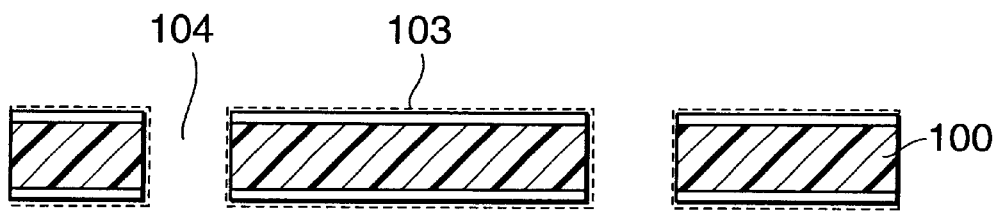
Figure 1C:
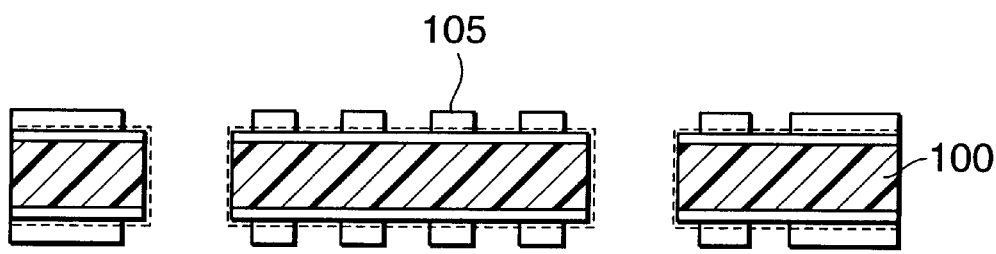
Figure 1D:
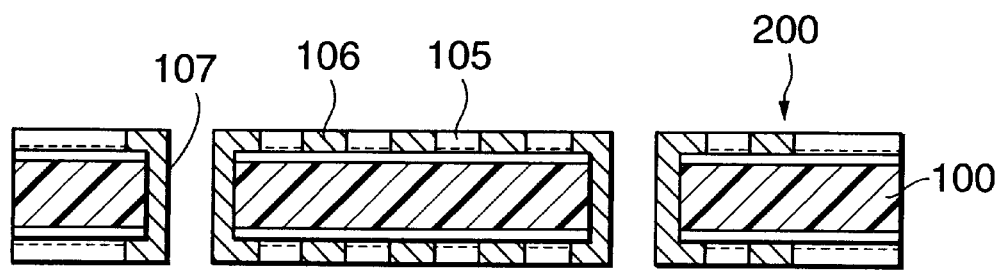
Figure 2A:
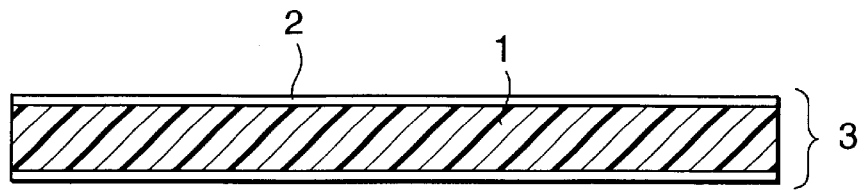
FIGS. 2A to 2E show production steps illustrating a first embodiment of a process for producing a printed wiring board of the present invention.

First, as shown in FIG. 2A, an insulating substrate 3 is prepared, in which adhesive layers 2 made of epoxy resin are formed on both surfaces of a base substrate 1 of a glass substrate made of epoxy resin. The adhesive layer 2 may also be made of polyimide resin or polyimide resin modified with epoxy resin, in place of epoxy resin.

Figure 2B:
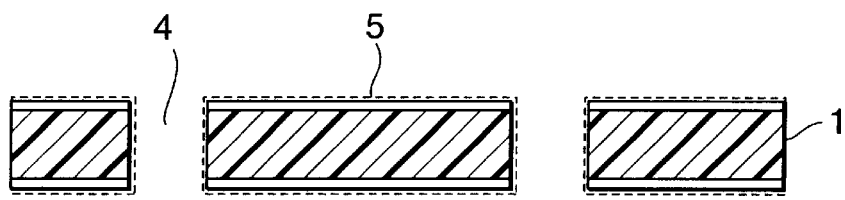

Next, as shown in FIG. 2B, after forming through-holes 4, the surfaces of walls of the through-holes 4 and the surfaces of the adhesive layers 2 are made hydrophilic, using a chemical roughening aqueous solution such as an alkaline permanganate solution or the like.

Then, catalyst cores 5 for electroless plating made of single metal particles of Pd or Cu are formed on the surfaces of the adhesive layers 2 and the surfaces of the walls of the through-holes 4. Herein, it is important that in the case where the catalyst cores 5 remain on a plating resist, the concentration of the catalyst cores 5 on the adhesive layers 2 should be regulated so that the insulation resistance between adjacent circuit lines after formation of the circuits becomes $10^9 \Omega$ or more.

Figure 5:
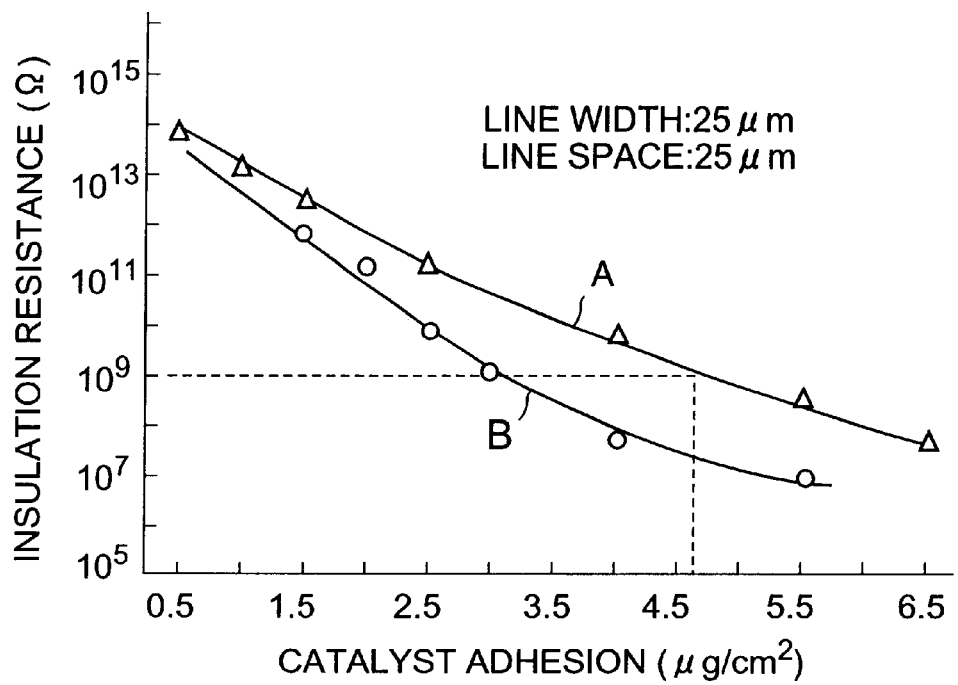
FIG. 5 is a graph showing a relationship between the catalyst adhesion and the inter-circuit insulation resistance.

FIG. 5 is a graph showing measurement results of the relationship between the catalyst adhesion concentration ($\mu g/cm^2$) on the adhesive layers of epoxy resin and the insulation resistance ($\Omega$) between adjacent circuit lines. A line width (L) and a line space (S) are 25 $\mu m$, respectively.

In FIG. 5, a curve A represents measurement results in the case where catalyst cores are formed of Pd single metal particles used in the present invention, and a curve B represents measurement results in the case where catalyst cores are formed of an Pd—Sn alloy using a conventional catalyst solution of a Pd—Sn mixed colloid. Under the same catalyst adhesion amount (weight), a decrease in insulation resistance is smaller in the case where catalyst cores are formed of Pd single metal particles used in the present invention.

Figure 6:
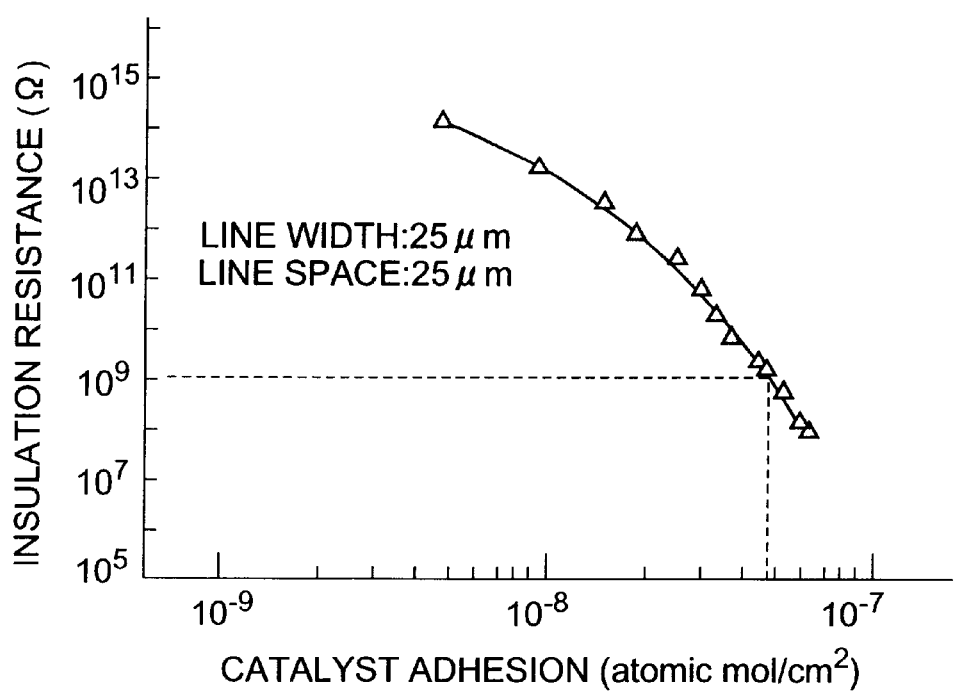
FIG. 6 is a graph showing a relationship between the catalyst adhesion and the inter-circuit insulation resistance.

FIG. 6 is a graph showing measurement results of the relationship between the catalyst adhesion concentration (atomic mol/cm$^2$) on the adhesive layers of epoxy resin and the insulation resistance ($\Omega$) between circuit lines. Even in the case where the catalyst cores 5 are formed of Cu single metal particles, the relationship in FIG. 6 holds.

According to the present invention, the catalyst adhesion amount (concentration of first catalyst cores 5) is controlled to be $4 \times 10^{-8}$ atomic mol/cm$^2$ or less in view of safety, so that the insulation resistance between circuit lines of $10^9 \Omega$ or more is obtained in the case where a conductive circuit with a line width (L) of 25 $\mu m$ and a line space (S) of 25 $\mu m$ is formed. The lower limit of the concentration of the catalyst cores 5 is set to $4.7 \times 10^{-9}$ atomic mol/cm$^2$. The reason for this will be described later.

The catalyst cores 5 can be formed on the adhesive layers 2 by the following method.

(1) In the case where the catalyst cores 5 are made of Pd single metal particles, Pd complex ions, in which palladium ions are bound by ligands such as ammonia, pyridine, pyridine-3-sulfonic acid, and 2-aminopyridine are allowed to adsorb to the surface of the insulating substrate 3. The Pd complex ions are chemically reduced by being soaked in an aqueous solution containing boron hydride such as dimethylamine borane (DMAB), whereby the catalyst cores 5 of Pd are formed.

(2) In the case where the catalyst cores 5 are made of Cu single metal particles, the catalyst cores 5 made of Cu particles can be formed on the surface of the adhesive layers 2, using a copper catalyst solution or the like described in the above-mentioned second prior art technique.

Figure 2C:
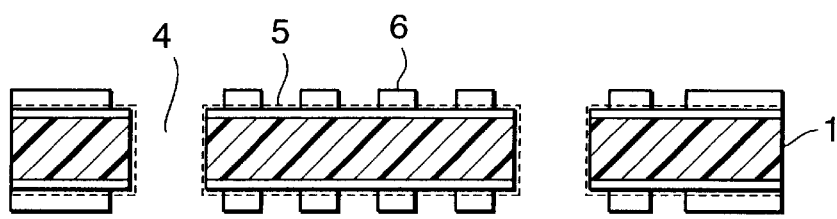

After the catalyst cores 5 are formed, as shown in FIG. 2C, a plating resist 6 is patterned on the adhesive layers 2.

As a material for the plating resist 6, an epoxy resin type photosensitive resist in a liquid form or a dry film form can be used. After the plating resist 6 is patterned, in order to enhance resistance to an electroless copper plating solution, the resultant insulating substrate 3 is subjected to heat treatment at a temperature of 100° C. or higher.

Next, the insulating substrate 3 with the plating resist 6 patterned thereon is defatted. Then, the insulating substrate 3 is washed in water, and then in a sulfuric acid aqueous solution. Then, the insulating substrate 3 is washed in water, and soaked in an aqueous solution containing an anionic surfactant (also generally called a conditioner solution), followed by washing in water. As the anionic surfactant, alkylphenyl sulfonate such as sodium dodecylbenzenesulfonate, polyoxyethylene alkyl ether sulfate, such as sodium polyoxyethylene lauryl ether sulfate, polyoxyethylene alkyl phenyl ether sulfate such as sodium polyoxyethylene nonyl phenyl ether sulfate, or the like can be used. An aqueous solution is used in which an anionic surfactant selected from the above examples is controlled to be a concentration of 200 to 3000 ppm. The aqueous solution containing an anionic surfactant is used in a liquid temperature range of 10° C. to 60° C.

Figure 2D:
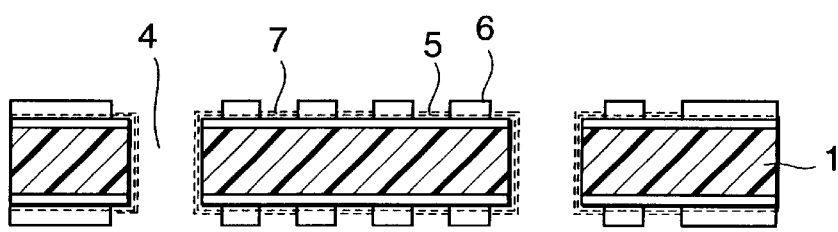

Next, the resultant insulating substrate 3 is soaked in a hydrochloric acid aqueous solution, and then in an acidic Pd—Sn mixed colloid catalyst aqueous solution, whereby a Pd—Sn mixed colloid is allowed to adsorb to the surfaces of the walls of the through-holes 4 and the surfaces of the insulating substrate 3. Then, the insulating substrate 3 is washed in water, and treated with a sulfuric acid aqueous solution or a fluoroboric acid aqueous solution, whereby the Pd—Sn mixed colloid adsorbing to the surface of the insulating substrate 3 is activated. As a result of this treatment, catalyst cores 7 made of a Pd—Sn alloy are formed on the surfaces of the insulating substrate 3 (FIG. 2D). The catalyst cores 7 are also formed on the surfaces of the through-holes 4 simultaneously.

The Pd—Sn mixed colloid catalyst aqueous solution is an acidic colloid aqueous solution formed by reducing palladium chloride with stannous chloride. The Pd—Sn mixed colloid particles are those which are negatively charged as a whole, where $Sn^{2+}$ ions and $Sn^{4+}$ ions adsorb to the periphery of Pd metal particles, and negative ions such as chlorine ions ($Cl^-$) excessively adsorb to the outermost side of the particles. The colloid particles are stably present repelling one another in an aqueous solution.

When the surface of the insulating substrate 3 is treated with an acidic aqueous solution (hereinafter, referred to as an "accelerator solution") such as sulfuric acid aqueous solution, fluoroboric acid aqueous solution, or the like, Pd—Sn mixed colloid particles excessively adsorbing to the surface of the insulating substrate 3 are dissolved in the accelerator solution, and simultaneously, the Pd—Sn mixed colloid particles remaining on the surface of the insulating substrate 3 are rearranged to form the catalyst cores 7 made of an active Pd—Sn alloy having a catalyst function of electroless plating.

Anionic surfactant molecules adsorb to the surface of the plating resist 6 when the surface is treated with an aqueous solution containing an anionic surfactant. When the insulating substrate 3 is treated with a Pd—Sn mixed colloid solution, the anionic surfactant molecules remain on the surface of the plating resist 6 and prevent the Pd—Sn mixed colloid from adsorbing to the surface of the plating resist 6. Even if the Pd—Sn mixed colloid adsorbs to the surface of the plating resist 6, the colloid is dissolved in the accelerator solution, and removed from the surface of the plating resist 6. As the Pd—Sn mixed colloid catalyst aqueous solution, commercially available palladium chloride—stannous chloride mixed colloid catalyst aqueous solution can be used.

Figure 2E:
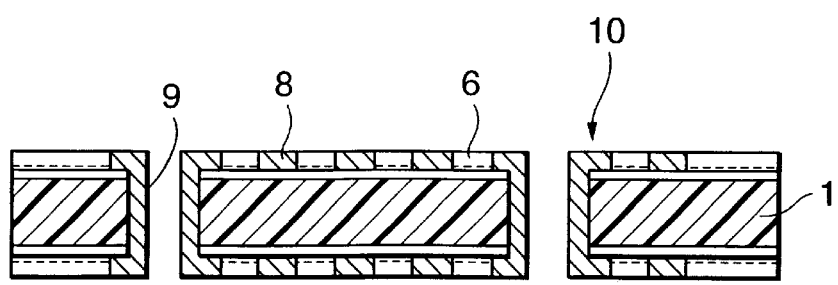

Next, as shown in FIG. 2E, the insulating substrate 3 thus obtained is soaked in an electroless copper plating solution containing EDTA as a complexing agent and formaldehyde as a reducing agent, whereby a copper plating film with a thickness of 10 to 20 $\mu$m is formed on the surfaces of the walls of the through-holes 4 and between the plating resists 6. Thus, conductive circuits 8 and copper plated through-holes 9 are formed to produce a printed wiring board 10.

According to the present invention, there is provided a process for producing a printed wiring board characterized by the following: the catalyst cores 5 made of Pd or Cu single metal particles are formed on the adhesive layers 2 in a concentration of $4.7 \times 10^{-9}$ to $4 \times 10^{-8}$ atomic mol/cm$^2$, and thereafter, the plating resist 6 is formed; and the resultant insulating substrate 3 is treated with an aqueous solution containing an anionic surfactant, and a Pd—Sn mixed colloid aqueous solution, followed by being washed in an acid, whereby the catalyst cores 7 made of an Pd—Sn alloy are selectively formed between the plating resists 6.

Figure 3A:
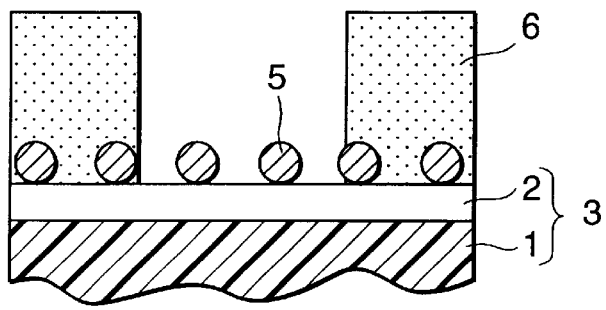
FIGS. 3A to 3D show production steps illustrating a mechanism of forming catalyst cores in the first embodiment of the process for producing a printed wiring board of the present invention.
Figure 3B:
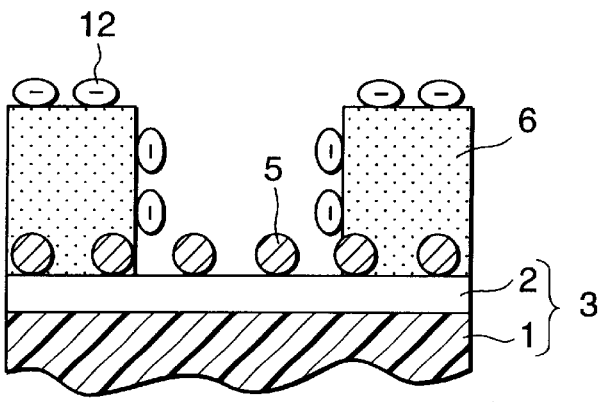

Next, the mechanism of forming the catalyst cores 7 will be described. FIG. 3A shows the state of a substrate in which the catalyst cores 5 are formed on the adhesive layer 2, and the plating resist 6 is patterned. After the substrate is treated with an aqueous solution (also generally called a "conditioner solution") containing an anionic surfactant and washed in water, anionic surfactant molecules 12 adsorb to the surface of the plating resist 6, and the substrate is negatively charged, as shown in FIG. 3B. The surface of the adhesive layer 2 is made hydrophilic, and negatively charged, so that the anionic surfactant molecules 12 are unlikely to adsorb to the surface of the adhesive layer 2.

Figure 3C:
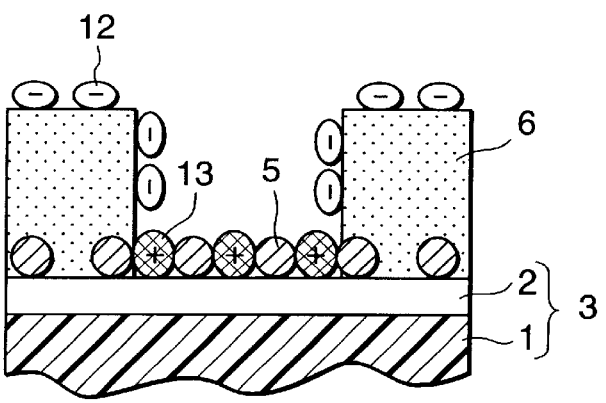

When the substrate is soaked in a catalyst solution of a Pd—Sn mixed colloid after being washed in water, since the Pd—Sn mixed colloid is negatively charged as a whole, the Pd—Sn mixed colloid is prevented from adsorbing to the plating resist 6, and selectively adsorbs to the adhesive layer 2 (FIG. 3C). Reference numeral 13 denotes catalyst core ions made of a Pd—Sn mixed colloid adsorbing to the adhesive layer 2. On the surface of the adhesive layer 2, the catalyst cores 5 are present, which have a function of promoting adsorption of the Pd—Sn mixed colloid.

As described above, the lower the concentration of the catalyst cores 5 adsorbing to the surface of the adhesive layer 2, the better the insulating property between circuits. However, in order to enhance adsorption of the Pd—Sn mixed colloid, it is required to set the concentration of the catalyst cores 5 to a certain level or higher. A preferable concentration is $4.7 \times 10^{-9}$ atomic mol/Cm$^2$ or more.

Figure 3D:
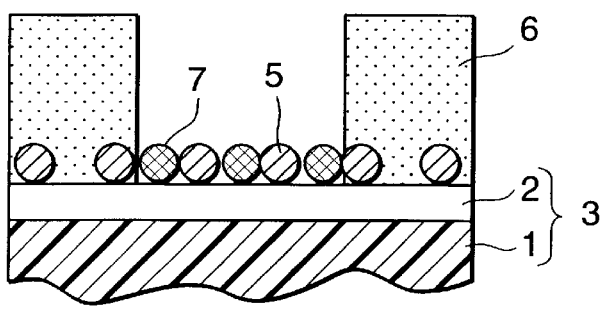

Then, the substrate is soaked in an accelerator solution, whereby the Pd—Sn mixed colloid excessively adsorbing to the surface of the adhesive layer 2 between the plating resists 6 is removed, and simultaneously, the Pd—Sn mixed colloid remaining on the surface of the adhesive layer 2 between the plating resists 6 is accelerated. Thus, the catalyst cores 7 made of a Pd—Sn alloy rich in Pd are formed between the plating resists 6 (FIG. 3D). In the case where the Pd—Sn mixed colloid adsorbs to the plating resist 6, the colloid is removed in the accelerator solution. Because of the presence of the catalyst cores 5 and 7 between the plating resists 6, electroless copper plating is likely to occur.

According to the present invention, the catalyst cores 5 made of Pd or Cu single metal particles are present under the plating resist 6. In this case, the concentration of the catalyst cores 5 is ½ to ⅓ of the conventional catalyst remaining amount, which shows that sufficient insulation reliability is ensured between circuits.

Next, a second embodiment of the process for producing a printed wiring board of the present invention will be described with reference to FIGS. 4A to 4D. According to the process for producing a printed wiring board of the present embodiment, the catalyst cores 5 in the above-mentioned first embodiment are formed in two stages. More specifically, as in the case of FIG. 2A, the through-holes 4 (not shown) are formed in the insulating substrate 3 with the adhesive layer 2 formed thereon, and the surface of the adhesive layer 2 is made hydrophilic by chemical roughening.

Figure 4A:
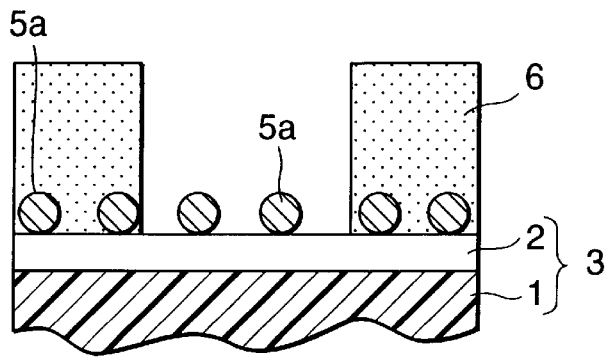
FIGS. 4A to 4D show production steps illustrating a mechanism of forming catalyst cores in a second embodiment of the process for producing a printed wiring board of the present invention.

Then, catalyst cores 5a made of Cu metal particles are formed on the surface of the adhesive layer 2, using a copper catalyst or the like described in the above-mentioned second prior art technique. Then, the plating resist 6 is patterned (FIG. 4A). The concentration of the catalyst cores 5a on the surface of the adhesive layer 2 is set to $4.7 \times 10^{-9}$ to $4 \times 10^{-8}$ atomic mol/cm$^2$, as in the above-mentioned first embodiment.

Figure 4B:
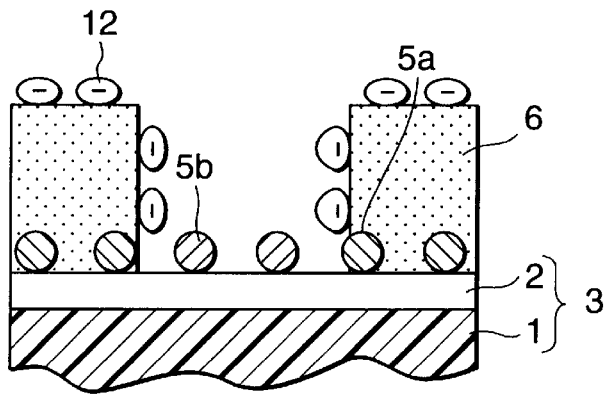

Next, the catalyst cores 5a made of Cu metal between the plating resists 6 are converted into catalyst cores 5b made of Pd, Ag, or Ni by a substitution reaction of ions (FIG. 4B). Conversion into Pd and Ag is conducted by a typical substitution reaction in which the catalyst cores 5a are brought into contact with a palladium chloride aqueous solution or a silver nitrate aqueous solution. Conversion into Ni cannot be conducted by atypical substitution reaction, since Ni has a larger ionization tendency than Cu. Therefore, it is required to reverse ionization potentials of Cu and Ni by adding thiourea to a nickel chloride aqueous solution. More specifically, when the catalyst cores 5a are brought into contact with a nickel chloride aqueous solution containing thiourea, a monovalent ion of copper forms a chelate with thiourea, and the oxidation-reduction potential of copper becomes lower than that of Ni, whereby the catalyst cores 5a of Cu can be replaced by the catalyst cores 5b of Ni. Since the catalyst cores 5b are less likely to be oxidized, as compared with the catalyst cores 5a, the adsorption of catalyst core ions 13 is enhanced in the subsequent step.

Figure 4C:
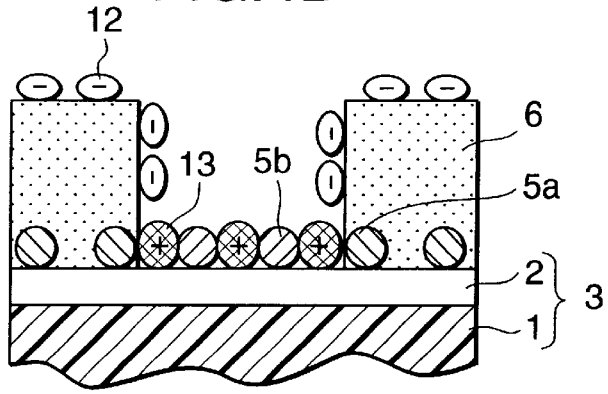

Then, the insulating substrate 3 is washed in water, and soaked in a catalyst solution of a Pd—Sn mixed colloid. Since the Pd—Sn mixed colloid is negatively charged as a whole, adsorption thereof to the plating resist 6 is suppressed, and the Pd—Sn mixed colloid adsorbs to the adhesive layer 2 (FIG. 4C). Reference numeral 13 denotes catalyst core ions made of a Pd—Sn mixed colloid adsorbing to the adhesive layer 2. On the surface of the adhesive layer 2, the catalyst cores 5b are present, which have a function of enhancing the adsorption of the Pd—Sn mixed colloid.

Figure 4D:
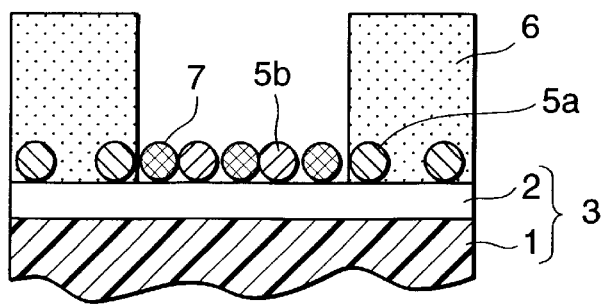

Then, the resultant insulating substrate 3 is soaked in an accelerator solution. As a result, the Pd—Sn mixed colloid excessively adsorbing to the surface of the adhesive layer between the plating resists 6 is removed, and simultaneously, the Pd—Sn mixed colloid remaining on the surface of the adhesive layer 2 between the plating resists 6 is activated, whereby the catalyst cores 7 made of a Pd—Sn alloy rich in Pd are formed between the plating resists 6 (FIG. 4D). In the case where the Pd—Sn mixed colloid adsorbs to the plating resist 6, the colloid is removed in the accelerator solution. Due to the presence of the catalyst cores 5b and the catalyst cores 7 between the plating resists 6, electroless copper plating is likely to occur.

In the above-mentioned embodiments of the present invention, an organic substrate made of epoxy resin or the like is used as an insulating substrate. However, a ceramic substrate may also be used in the present invention. Furthermore, a multi-layered substrate may also be used as a base substrate. Furthermore, a base substrate rich in resin without using an adhesive layer may also be used in place of an insulating substrate with an adhesive layer formed thereon.

In the above-mentioned embodiments of the present invention, electroless copper plating is used. However, electroless nickel plating or a combination of electroless copper plating and electroless nickel plating can be used in place of electroless copper plating.

Hereinafter, the present invention will be described by way of specific examples. It should be noted that the present invention is not limited thereto.

EXAMPLE 1

An epoxy resin glass substrate of was covered with an adhesive layer (thickness: 50 µm) made of thermosetting epoxy resin, and cured by heating, whereby an insulating substrate was formed. The insulating substrate was soaked in an alkaline sodium permanganate aqueous solution at a liquid temperature of 60° C. for 5 minutes to make the surface of the adhesive layer hydrophilic.

Then, the insulating substrate was washed in water, and permanganate ions remaining on the surface of the adhesive layer was reduced with a hydrazine sulfate aqueous solution. Then, the insulating substrate was washed in water, and soaked in a Pd complex compound aqueous solution (pH=10.5) for 5 minutes, followed by washing in water. Then, the insulating substrate was soaked in a reducing agent (sodium borohydride) for 3 minutes, whereby the Pd complex compound adsorbing to the insulating substrate was reduced. On the insulating substrate, Pd (catalyst cores) was formed in an amount of 1.2 µg/cm$^2$ ($1.127\times10^{-8}$ atomic mol/cm$^2$). This Pd adsorption concentration corresponds to the case where an insulation resistance between circuit lines, in which a line width and a line space are about 25 µm, respectively, becomes about $10^{13}\Omega$.

Next, after the insulating substrate was washed in water, the insulating substrate was dried at 120° C. for 30 minutes and cooled. Thereafter, a plating resist pattern of a reverse plate with a line width of 25 µm and a line space of 25 µm was formed on the adhesive layer of the insulating substrate, using a liquid photosensitive plating resist (thickness: about 20 µm) of epoxy resin.

Then, the insulating substrate was soaked in a defatting solution at a liquid temperature of 60° C. for 5 minutes, and washed in water and an acid. The insulating substrate was soaked in a conditioner solution containing an anionic surfactant of sodium dodecylbenzenesulfonate for 3 minutes. After the insulating substrate was washed in water, the substrate was soaked in a Pd—Sn mixed colloid aqueous solution for about 3 minutes. After the insulating substrate was washed in water, the substrate was soaked in an accelerator (acidic solution containing sulfuric acid) for 5 minutes. The insulating substrate was washed in water, and plated with an electroless copper plating solution containing EDTA as a complexing agent, whereby an electroless copper plating film with a thickness of about 20 µm was deposited between the plating resists of the insulating substrate. On the plating resists of the insulating substrate, an electroless copper plating film was not deposited. Furthermore, an insulation resistance between circuit lines was $10^{12}\Omega$ or more. Thus, it was confirmed that a high insulating property is ensured.

EXAMPLE 2

A glass substrate of epoxy resin was covered with an adhesive layer (thickness: 50 µm) made of thermosetting epoxy resin, and cured by heating, whereby an insulating substrate was formed. The insulating substrate was soaked in an alkaline sodium permanganate aqueous solution at a liquid temperature of 60° C. for 5 minutes to make the surface of the adhesive layer hydrophilic.

Then, the insulating substrate was washed in water, and permanganate ions remaining on the surface of the adhesive layer of the insulating substrate was reduced with a hydrazine sulfate aqueous solution. Then, the insulating substrate was washed in water and soaked in a copper colloid catalyst solution, whereby catalyst cores made of Cu particles were formed on the surface of the adhesive layer of the insulating substrate in a concentration of about $3\times10^{-8}$ atomic mol/cm$^2$ (about 1.9 µg/cm$^2$).

The insulating substrate was washed in water. Thereafter, the insulating substrate was dried at 120° C. for 30 minutes in a nitrogen atmosphere and cooled. Then, a plating resist of a reverse plate with a line width of 25 µm and a line space of 25 µm was patterned on the adhesive layer by using a liquid photosensitive plating resist (thickness: about 20 µm) of epoxy resin.

Then, the insulating substrate was soaked in an acidic aqueous solution of palladium chloride for about 3 minutes, whereby catalyst cores made of Cu particles adsorbing to the surface of the adhesive layer between the plating resists were replaced by Pd. The purpose of drying the insulating substrate in a nitrogen atmosphere is to suppress oxidation of catalyst cores made of Cu particles.

Then, the insulating substrate was soaked in a defatting solution at a liquid temperature of 60° C. for 5 minutes, and washed in water and an acid. The insulating substrate was soaked in a conditioner solution containing an anionic surfactant of sodium dodecylbenzenesulfonate for 3 minutes, and after being washed in water, the substrate was soaked in a Pd—Sn mixed colloid catalyst aqueous solution for about 3 minutes. After the insulating substrate was washed in water, the substrate was soaked in an accelerator (acidic solution containing sulfuric acid) for 5 minutes. The insulating substrate was washed in water, and plated with an electroless copper plating solution (at a liquid temperature of about 70° C.) containing EDTA as a complexing agent, whereby an electroless copper plating film with a thickness of about 20 µm was deposited between the plating resists of the insulating substrate. On the plating resists, an electroless copper plating film was not deposited. Furthermore, an inter-circuit insulation resistance was $10^{11}\Omega$ or more. Thus, it was confirmed that a high insulating property is ensured.

As described above, according to the present invention, the following advantages are obtained.

(1) The concentration of a catalyst in conductive circuit forming regions is prevented from decreasing, and the concentration of an electroless copper plating catalyst remaining under a plating resist (i.e., between conductive circuits) can be lowered to ½ to ⅓ of that obtained by the conventional technique of forming a catalyst over the entire surface.

(2) Because of the above, a printed wiring board having high-density circuits with a line width of 50 µm or less and a line space of 50 µm or less can be produced (which has been conventionally difficult) on the surface of an insulating substrate by a full-additive process without impairing the electrical insulating property between circuits.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A process for producing a printed wiring board comprising the steps of:
   a first step of forming first catalyst cores for electroless plating on a substrate having an insulating surface, the first catalyst cores made of single metal particles;
   a second step of patterning a plating resist formed on the substrate so as to selectively expose the first catalyst cores from the plating resist;
   a third step of forming second catalyst cores for electroless plating on the surface of the substrate exposed from the plating resist, the second catalyst cores being made of alloy particles; and
   a fourth step of forming conductive circuits made of an electroless plating film on area associated with the first catalyst cores and the second catalyst cores exposed from the plating resist.

2. A process for producing a printed wiring board according to claim 1, wherein the third step further includes a step of treating the surface of the plating resist with an aqueous solution containing an anionic surfactant before forming the second catalyst cores.

3. A process for producing a printed wiring board according to claim 1, wherein the first step further includes a step of making the surface of the substrate hydrophilic before forming the first catalyst cores on the surface of the substrate.

4. A process for producing a printed wiring board according to claim 1, wherein the first catalyst cores are selected from the group consisting of palladium particles and copper particles.

5. A process for producing a printed wiring board according to claim 1, wherein the concentration of the first catalyst cores is set to between $4.7 \times 10^{-9}$ and $4 \times 10^{-8}$ atomic mol/$cm^2$.

6. A process for producing a printed wiring board according to claim 1, wherein the first catalyst cores are made of palladium particles, and the palladium particles are formed by chemically reducing palladium complex ions adsorbing to the substrate.

7. A process for producing a printed wiring board according to claim 6, wherein a ligand of the palladium ions is one selected from a group consisting of ammonia, pyridine, pyridine-3-sulfonic acid, and 2-aminopyridine.

8. A process for producing a printed wiring board according to claim 1, wherein the first catalyst cores are made of copper particles which are formed by allowing a copper colloid to adsorb to the substrate.

9. A process for producing a printed wiring board according to claim 1, wherein the second catalyst cores are made of a palladium—tin alloy formed by using a catalyst solution containing palladium—tin mixed colloid.

10. A process for producing a printed wiring board according to claim 1, further includes a fifth step between the second step and the third step, in which the first catalyst cores on the surface of the substrate exposed from the plating resist are replaced by third catalyst cores having electroless plating catalyst performance by an ion substitution reaction.

11. A process for producing a printed wiring board according to claim 10, wherein the first catalyst cores are made of copper particles.

12. A process for producing a printed wiring board according to claim 11, wherein the third catalyst cores are made of one selected from the group consisting of palladium, silver, and nickel.

* * * * *